(12) United States Patent
Yantchev

(10) Patent No.: US 12,362,725 B2
(45) Date of Patent: Jul. 15, 2025

(54) TRANSVERSELY-EXCITED FILM BULK ACOUSTIC FILTERS WITH EXCESS PIEZOELECTRIC MATERIAL REMOVED

(71) Applicant: Murata Manufacturing Co., Ltd., Nagaokakyo (JP)

(72) Inventor: Ventsislav Yantchev, Sofia (BG)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 356 days.

(21) Appl. No.: 17/958,311

(22) Filed: Sep. 30, 2022

(65) Prior Publication Data

US 2023/0024966 A1 Jan. 26, 2023

Related U.S. Application Data

(63) Continuation-in-part of application No. 17/123,029, filed on Dec. 15, 2020, now Pat. No. 11,496,113.

(60) Provisional application No. 63/113,301, filed on Nov. 13, 2020.

(51) Int. Cl.
*H03H 9/56* (2006.01)
*H03H 3/02* (2006.01)
*H03H 9/02* (2006.01)
*H03H 9/205* (2006.01)

(52) U.S. Cl.
CPC .............. *H03H 9/568* (2013.01); *H03H 3/02* (2013.01); *H03H 9/02228* (2013.01); *H03H 9/205* (2013.01)

(58) Field of Classification Search
CPC ...... H03H 9/568; H03H 3/02; H03H 9/02228; H03H 9/205; H03H 9/564; H03H 2003/023; H03H 9/02015; H03H 9/174

USPC .................. 333/133, 186–188, 193–196
See application file for complete search history.

(56) References Cited

U.S. PATENT DOCUMENTS

| 5,853,601 | A | 12/1998 | Krishaswamy et al. |
| 6,540,827 | B1 | 4/2003 | Levy et al. |
| 6,707,229 | B1 | 3/2004 | Martin |
| 7,105,980 | B2 | 9/2006 | Abbott et al. |
| 7,463,118 | B2 | 12/2008 | Jacobsen |
| 7,535,152 | B2 | 5/2009 | Ogami et al. |

(Continued)

FOREIGN PATENT DOCUMENTS

| JP | 2018093487 A | 6/2018 |
| WO | 2016017104 A1 | 2/2016 |

(Continued)

OTHER PUBLICATIONS

Acoustic Properties of Solids, ONDA Corporation, Apr. 11, 2003, pp. 5.

(Continued)

*Primary Examiner* — Jorge L Salazar, Jr.
(74) *Attorney, Agent, or Firm* — ARENTFOX SCHIFF LLP

(57) ABSTRACT

Filter devices and fabrication methods are disclosed. A filter device includes a piezoelectric plate and a conductor pattern on a front surface of the piezoelectric plate. The conductor pattern includes interdigital transducers (IDTs) of a plurality of transversely-excited film bulk acoustic resonators (XBARs) and a plurality of conductors connecting the plurality of XBARs in a ladder filter circuit architecture. The plurality of conductors includes a first conductor adjacent to a second conductor. An opening is provided through the piezoelectric plate between the first conductor and the second conductor.

19 Claims, 10 Drawing Sheets

(56) References Cited

U.S. PATENT DOCUMENTS

| | | |
|---|---|---|
| 7,684,109 B2 | 3/2010 | Godshalk et al. |
| 7,868,519 B2 | 1/2011 | Umeda |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li et al. |
| 9,425,765 B2 | 8/2016 | Rinaldi et al. |
| 9,525,398 B1 | 12/2016 | Olsson et al. |
| 9,748,923 B2 | 8/2017 | Kando et al. |
| 9,780,759 B2 | 10/2017 | Kimura et al. |
| 10,200,013 B2 | 2/2019 | Bower et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 11,496,113 B2 | 11/2022 | Yantchev |
| 2002/0079986 A1 | 6/2002 | Ruby et al. |
| 2002/0158714 A1 | 10/2002 | Kaitila et al. |
| 2003/0199105 A1 | 10/2003 | Kub et al. |
| 2004/0261250 A1 | 12/2004 | Kadota et al. |
| 2007/0194863 A1 | 8/2007 | Shibata et al. |
| 2010/0064492 A1 | 3/2010 | Tanaka |
| 2010/0123367 A1 | 5/2010 | Tai et al. |
| 2011/0109196 A1 | 5/2011 | Goto et al. |
| 2011/0278993 A1 | 11/2011 | Iwamoto |
| 2012/0274416 A1 | 11/2012 | Hara et al. |
| 2013/0234805 A1 | 9/2013 | Takahashi |
| 2013/0321100 A1 | 12/2013 | Wang |
| 2014/0009032 A1 | 1/2014 | Takahashi et al. |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2015/0319537 A1 | 11/2015 | Perois et al. |
| 2015/0333730 A1 | 11/2015 | Meltaus et al. |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214387 A1 | 7/2017 | Burak et al. |
| 2017/0222622 A1 | 8/2017 | Solal et al. |
| 2017/0370791 A1 | 12/2017 | Nakamura et al. |
| 2018/0123016 A1 | 5/2018 | Gong et al. |
| 2018/0152169 A1 | 5/2018 | Goto et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong et al. |
| 2019/0273480 A1 | 9/2019 | Lin et al. |
| 2020/0328728 A1 | 10/2020 | Nakagawa et al. |

FOREIGN PATENT DOCUMENTS

| | | |
|---|---|---|
| WO | 2016/052129 | 4/2016 |
| WO | 2018003273 A1 | 1/2018 |
| WO | 20190138810 A1 | 7/2019 |

OTHER PUBLICATIONS

Bahreynl, B., "Fabrication and Design of Resonant Microdevices," Norwich, NY, William Andrew, Inc., 2008, 5 pages.

Diaphragm Definition and Meaning, Merriam-Webster, since 1828, 1 page.

Ekeom et al., "Solidly Mounted Resonator (SMR) FEM-BEM Simulation," Proceedings of the IEEE Ultrasonics Symposium, Nov. 2006, 5 pages.

International Search Report and Written Opinion in PCT/US2019/058632, mailed Jan. 17, 2020, 8 pages.

International Search Report and Written Opinion in PCT/US2019/36433, mailed Aug. 29, 2019, 9 pages.

Kadota et al., "Wideband acoustic wave resonators composed of hetero acoustic layer structure," Japanese Journal of Applied Physics, 2018, vol. 57, 07LD12, 4 pages.

Manohar, G., "Investigation of Various Surface Acoustic Wave Design Configurations for Improved Sensitivity," Doctoral Dissertation, Jan. 2017, University of South Florida, 112 pages.

Material Properties of Tibtech Innovations, TIBTECH Innovations, 2018, 1 page.

Mizutaui et al., "Analysis of Lamb Wave Propagation Characteristics in Rotated Y-Cut X-Propagation LiNbO3 Plates," Electronics and Communications in Japan (Part 1: Communications), 1986, vol. 69, No. 4, pp. 47-55.

Moussa et al., "Review on Triggered Liposomal Drug Delivery with a Focus on Ultrasound," Current Cancer Drug Targets, 2015, vol. 15, No. 4, pp. 1-34.

Naumenko et al., "Optimal orientations of Lithium Niobate for resonator SAW filters," 2003 IEEE Ultrasonics Symposium, Oct. 5-8, 2003, Honolulu, Hawaii, pp. 2110-2113.

Olsson III et al., "A high electromechanical coupling coefficient SH0 Lamb wave lithium niobate micromechanical resonator and a method for fabrication," Sensors and Actuators A: Phyiscal, 2014, vol. 209, pp. 183-190.

Safari et al., "Piezoelectric for Transducer Applications," Elsevier Science Ltd., 2000, pp. 4 (29 pages).

Takai et al., "I.H.P.Saw Technology and its Application to Microacoustic Components (Invited)," 2017 IEEE International Ultrasonics Symposium (IUS), 2017, pp. 1-8.

Yang et al., "5 GHZ lithium niobate MEMS resonators with high FoM of 153," 2017 IEEE 30th International Conference on Micro Electro Mechanical Systems (MEMS), 2017, pp. 942-945.

Yang et al., "Toward Ka Band Acoustics: Lithium Niobat Asymmetrical Mode Piezoelectric MEMS Resonators," 2018 EEE International Frequency Control Symposium (IFCS), 2018, 5 pages.

TRANSVERSELY-EXCITED FILM BULK ACOUSTIC FILTERS WITH EXCESS PIEZOELECTRIC MATERIAL REMOVED

RELATED APPLICATION INFORMATION

This patent is a continuation-in-part of application U.S. application Ser. No. 17/123,029, titled XBAR DEVICES WITH EXCESS PIEZOELECTRIC MATERIAL REMOVED, filed Dec. 15, 2020, which claims priority to U.S. provisional patent application No. 63/113,301, titled XBAR DEVICES WITH EXCESS PIEZOELECTRIC MATERIAL REMOVED, filed Nov. 13, 2020.

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in patent U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator or the same two least significant digits.

DETAILED DESCRIPTION

Description of Apparatus

The Shear-Mode Film Bulk Acoustic Resonator (XBAR) is a new resonator structure for use in microwave filters. The XBAR is described in patent U.S. Pat. No. 10,491,291, titled TRANSVERSELY EXCITED FILM BULK ACOUSTIC RESONATOR, which is incorporated herein by reference in its entirety. An XBAR resonator comprises an interdigital transducer (IDT) formed on a thin floating layer, membrane or diaphragm, of a piezoelectric material. A microwave signal applied to the IDT excites a shear primary acoustic wave in the piezoelectric diaphragm, such that the acoustic energy flows substantially normal to the surfaces of the layer, which is orthogonal or transverse to the direction of the electric field generated by the IDT. XBAR resonators provide very high electromechanical coupling and high frequency capability.

The following describes improved XBAR resonators, filters and fabrication techniques for XBAR resonators with excess piezoelectric material removed. The excess piezoelectric material between some or all conductors (other than the fingers of the IDTs) of an RF filter is removed to avoid exciting acoustic modes that then couple to the substrate and increase insertion loss. The excess piezoelectric material may be removed from between pairs of conductors outside of the XBAR resonators of an RF filter, such as from between a signal conductor and a ground conductor, or from between two signal conductors.

Figure 1:
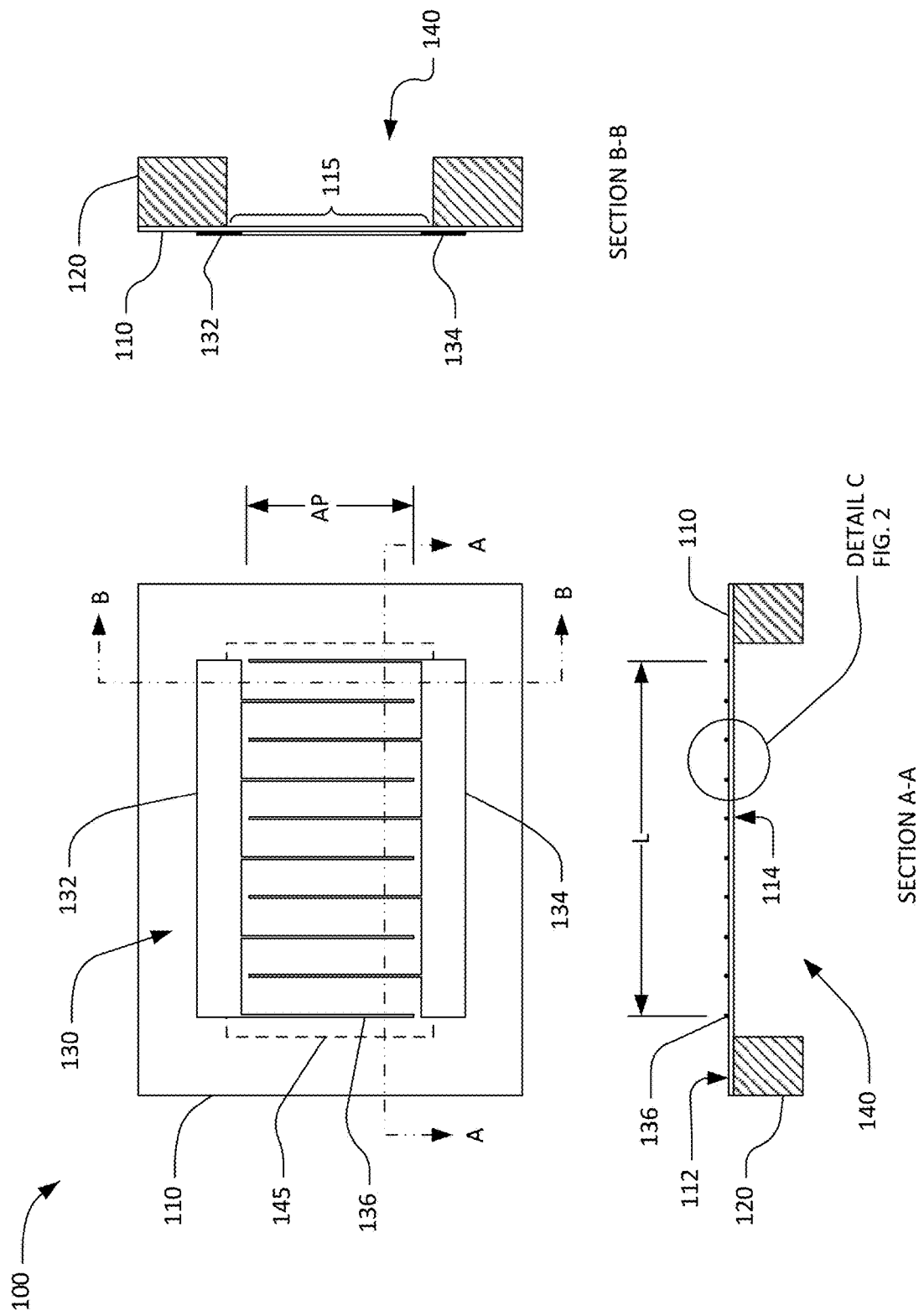
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented, the piezoelectric plates may be Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate may have layers of silicon thermal oxide (TOX) and crystalline silicon. The back surface 114 of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers. As shown in FIG. 1, the diaphragm 115 is contiguous with the rest of the piezoelectric plate 110 around all of a perimeter 145 of the cavity 140. In this context, "contiguous" means "continuously connected without any intervening item".

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers 136 overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal to, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120 or the bottom of the cavity. "Cavity" has its conventional meaning of "an empty space within a solid body." The cavity may contain a gas, air, or a vacuum. In some case, there is also a second substrate, package or other material having a cavity (not shown) above the plate 110, which may be a mirror image of substrate 120 and cavity 140. The cavity above plate 110 may have an empty space depth greater than that of cavity 140. The fingers extend over (and part of the busbars may optionally extend over) the cavity (or between the cavities). The cavity 140 may be a hole completely through the substrate 120 (as shown in Section A-A and Section B-B of FIG. 1) or a recess in the substrate 120 (as shown subsequently in FIG. 3). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item".

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
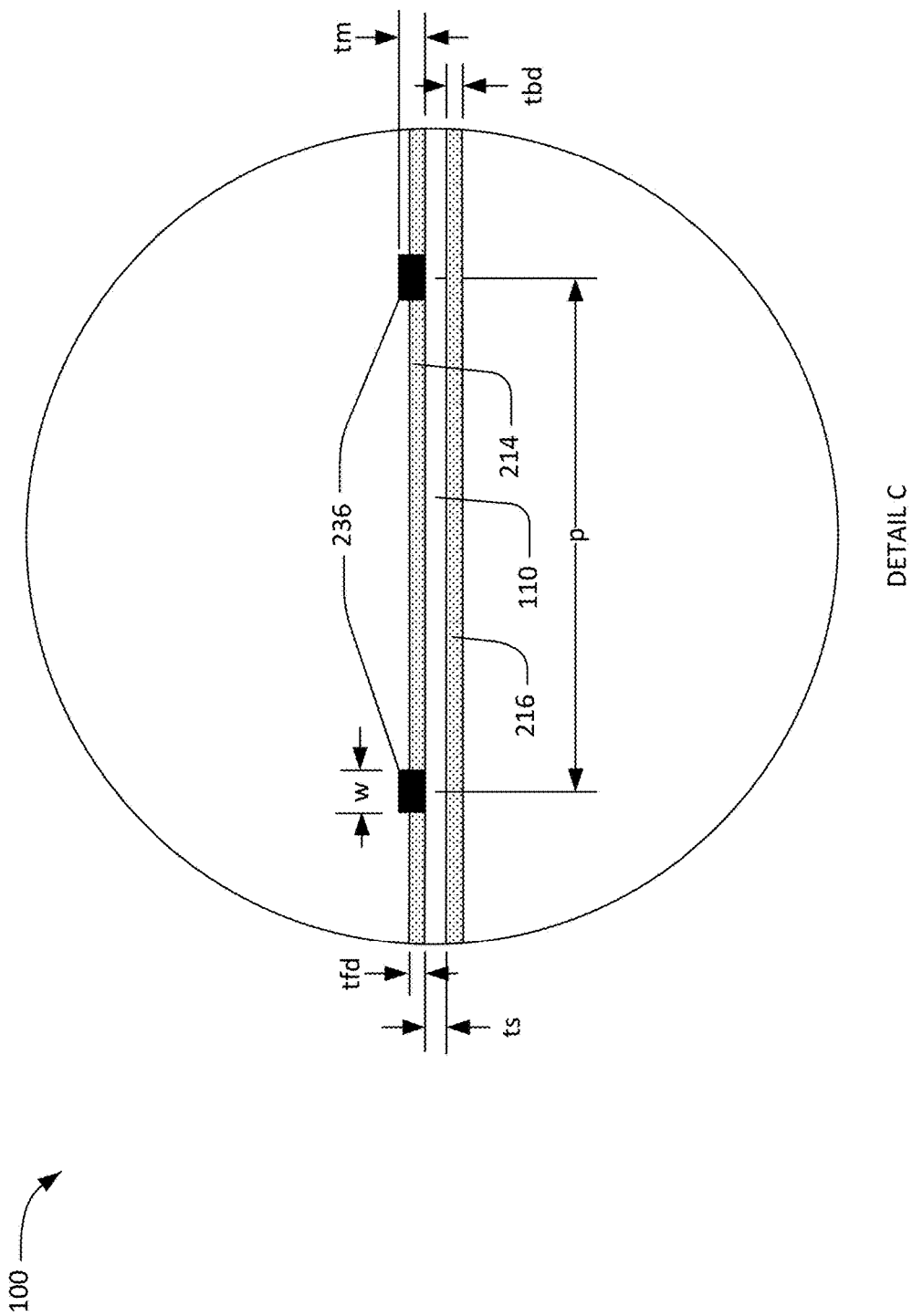
FIG. 2 is an expanded schematic cross-sectional view of a portion of the XBAR of FIG. 1.

FIG. 2 shows a detailed schematic cross-sectional view of the XBAR 100 of FIG. 1. The cross-sectional view may be a portion of the XBAR 100 that includes fingers of the IDT. The piezoelectric plate 110 is a single-crystal layer of piezoelectrical material having a thickness ts. The ts may be, for example, 100 nm to 1500 nm. When used in filters for LTE™ bands from 3.4 GHz to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. The tfd and tbd may be, for example, 0 to 500 nm. tfd and tbd are typically less than the thickness ts of the piezoelectric plate. The tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side frequency-setting dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal conductors from water and chemical corrosion, particularly for power durability purposes. It may range from 10 to 100 nm. The passivation material may consist of multiple oxide and/or nitride coatings such as SiO2 and Si3N4 material.

The IDT fingers 238 may be one or more layers of aluminum or a substantially aluminum alloy, copper or a substantially copper alloy, beryllium, tungsten, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. In some devices, the center-to-center spacing of the IDT fingers may vary along the length of the IDT, in which case p is the average of the center-to-center spacing of all pairs of adjacent fingers in the IDT. The width of the IDT fingers may vary along the length of the IDT, in which case w is the average width of all IDT fingers.

The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
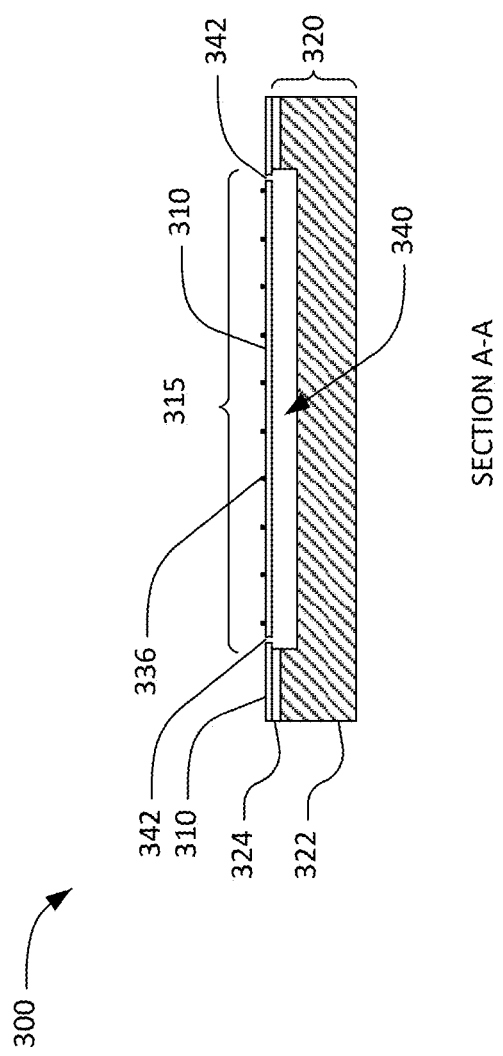
FIG. 3 is an alternative schematic cross-sectional view of an XBAR.

FIG. 3 is an alternative cross-sectional view of XBAR device 300 along the section plane A-A defined in FIG. 1. In FIG. 3A, a piezoelectric plate 310 is attached to a substrate 320. The substrate 320 includes a base 322 and an intermediate layer 324 between the base 322 and the piezoelectric plate 310. The base 322 may be, for example, silicon and the intermediate layer 324 may be a dielectric such as silicon dioxide or silicon nitride. A portion of the piezoelectric plate 310 forms a diaphragm 315 spanning a cavity 340 in the substrate. The cavity 340, does not fully penetrate the substrate 320. The cavity 340 may be confined to the intermediate layer 324 (not shown) or may fully penetrate the intermediate layer 324. The cavity 340 may extend into the base 322 (as shown). The cavity 340 is disposed under the portion of the piezoelectric plate 310 containing the IDT of an XBAR. Fingers, such as finger 336, of an IDT are disposed on the diaphragm 315. Plate 310, diaphragm 315 and fingers 336 may be plate 110, diaphragm 115 and fingers 136. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. The diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

One or more intermediate material layers 324 may be attached between plate 310 and base 322. An intermediary layer may be a bonding layer, an etch stop layer, a sealing layer, an adhesive layer or layer of other material that is attached or bonded between the piezoelectric plate 310 and base 322.

While the cavity 340 is shown in cross-section, it should be understood that the lateral extent of the cavity is a continuous closed band area of substrate 320 that surrounds and defines the size of the cavity 340 in the direction normal to the plane of the drawing. The lateral (i.e. left-right as shown in the figure) extent of the cavity 340 is defined by the lateral edges substrate 320. The vertical (i.e. down from plate 310 as shown in the figure) extent or depth of the cavity 340 into substrate 320. In this case, the cavity 340 has a side cross-section rectangular, or nearly rectangular, cross section.

The XBAR 300 shown in FIG. 3 will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110. The XBAR 300 shows one or more openings 342 in the piezoelectric plate 310 at the left and right sides of the cavity 340. However, in some cases openings 342 in the piezoelectric plate 310 are only at the left or right side of the cavity 340.

Figure 4:
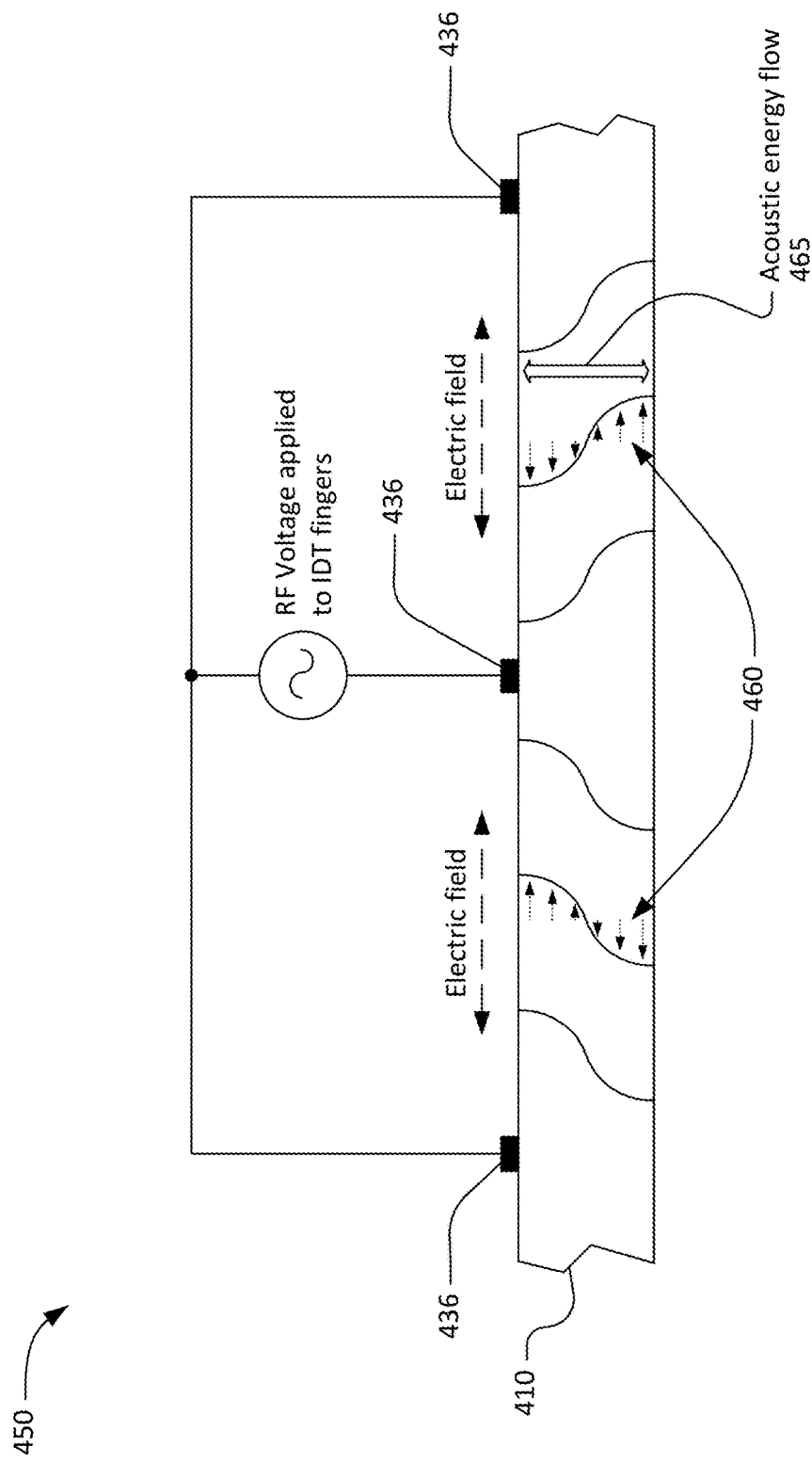
FIG. 4 is a graphical illustration of the primary acoustic mode of interest in an XBAR.

FIG. 4 is a graphical illustration of the primary acoustic mode of interest in an XBAR. FIG. 4 shows a small portion of an XBAR 450 including a piezoelectric plate 410 and three interleaved IDT fingers 436. XBAR 450 may be part of any XBAR herein. An RF voltage is applied to the interleaved fingers 436. This voltage creates a time-varying electric field between the fingers. The direction of the electric field is primarily lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 410. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 450 are represented by the curves 460, with the adjacent small arrows providing a schematic indication of the direction and magnitude of atomic motion. The degree of atomic motion, as well as the thickness of the piezoelectric plate 310, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the front and back surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
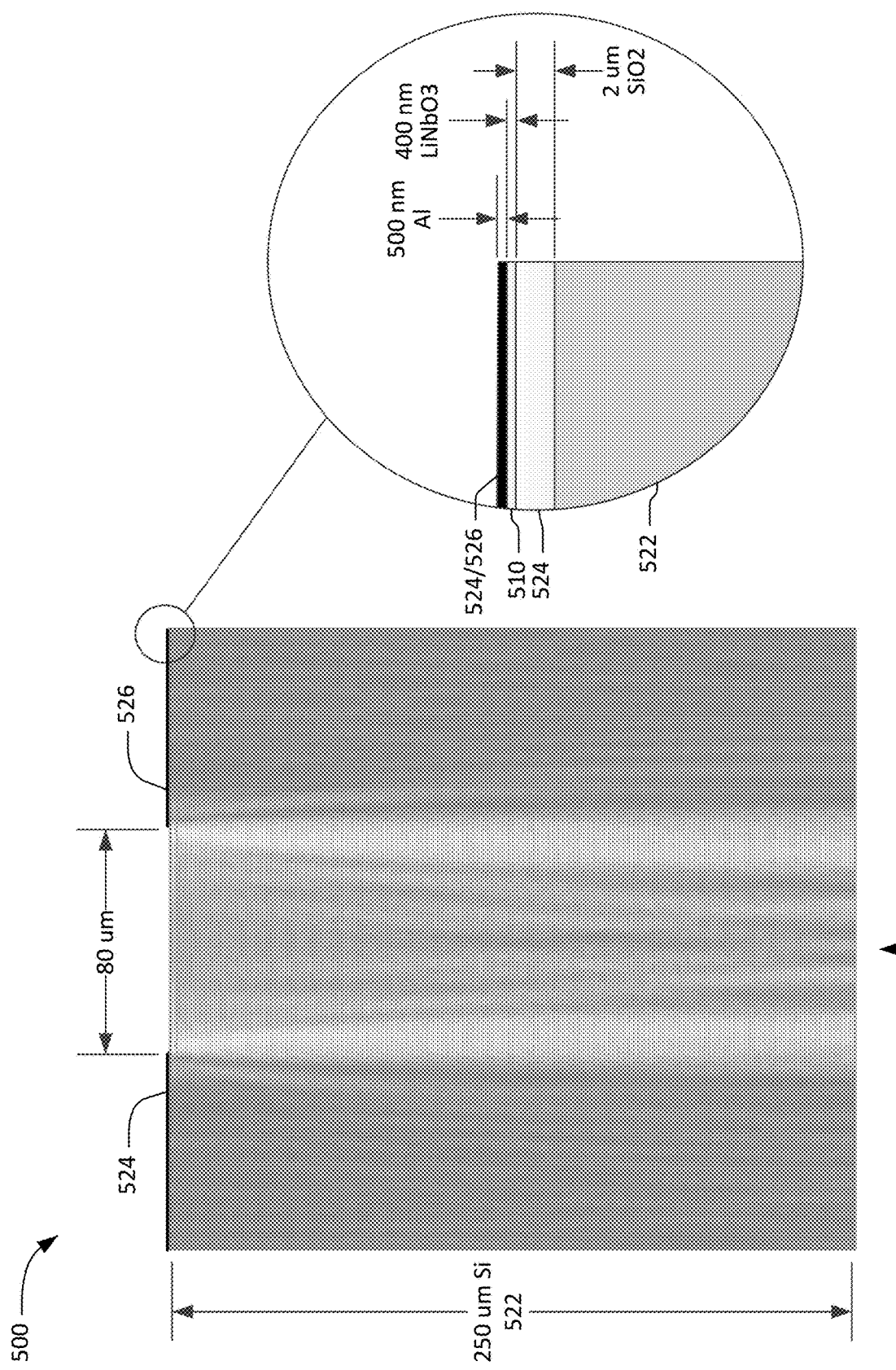
FIG. 5 is a cross-sectional view of a simulation of the acoustic modes excited between conductors in an XBAR device.

FIG. 5 is a cross-sectional view of a simulation of the acoustic modes 560 excited by two conductors 524 and 526 in an exemplary XBAR device 500. The device includes a 400 nm thick layer of lithium niobate piezoelectric material 510 bonded to base including a silicon substrate 522 that is 250 um thick. A 2 micron thick intermediate layer 524 is disposed between the piezoelectric layer 510 and the base 522. The intermediate layer may be Al2O3 or SiO2. Intermediate layer 524 may be bonded to piezoelectric layer 510 and base 522, thus bonding them together. Two conductors 524 and 526 (e.g., electrodes) are formed on the top surface of piezoelectric layer 510. The conductors represent, for example, a signal electrode and a ground electrode or two signal electrodes with different potential on the surface of an XBAR filter. In this illustrative example, the electrodes are aluminum, 500 nm thick, and separated by 80 microns. The piezoelectric layer 510 and intermediate layer 422 extend across the 80 micron separation between the conductors 524, 526 without being bonded to or covered by the conductors.

A radio frequency electric field between the conductors 524 and 526 (as would occur if 524 and 526 are a signal conductor and a ground conductor in a filter) excites a shear acoustic mode in the piezoelectric layer 510 between the conductors. The acoustic mode travels through the bonding layer 524 and the base 522. If the back surface of the base is polished, the acoustic mode reflects such that the surface of the piezoelectric plate and the back surface of the substrate form a resonant cavity. If the back surface of the substrate is textured (for example by grinding) the acoustic mode is dispersed after reflection.

Figure 6:
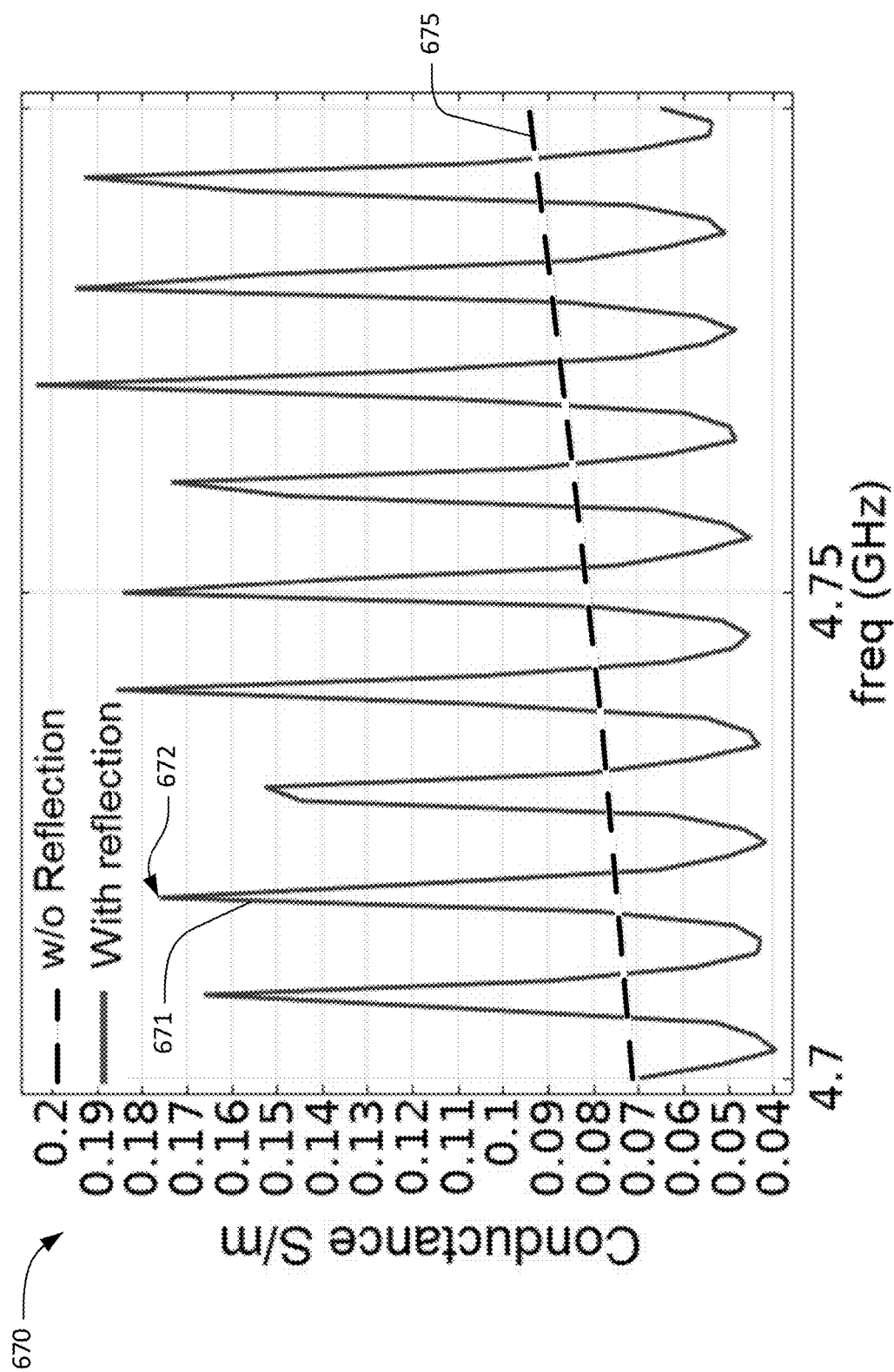
FIG. 6 is a graph of the conductance of the structure shown in FIG. 5

FIG. 6 is a graph 670 of the conductance of the structure shown in FIG. 5 as a function of frequency (GHz). Conductance is normalized to Siemens per meter of conductor length perpendicular to the plane of FIG. 5. The curve 671 is a plot of the conductance when the back surface of the base 522 is polished. In this case, the top surface of the piezoelectric layer and the back surface of the substrate form a cavity that results in resonance peaks 672 separated by about 10 MHz. These resonance peaks may result in undesired effects such as ripple within the passband of the filter having device 500. The dashed curve 675 is a plot of the conductance when the back surface of the silicon substrate is suitably textured (e.g. fine ground). In this case, the resonance peaks do not form. The residual conductance contributes to the insertion loss of the filter. This increase in insertion loss can be detrimental to filter performance.

Figure 7:
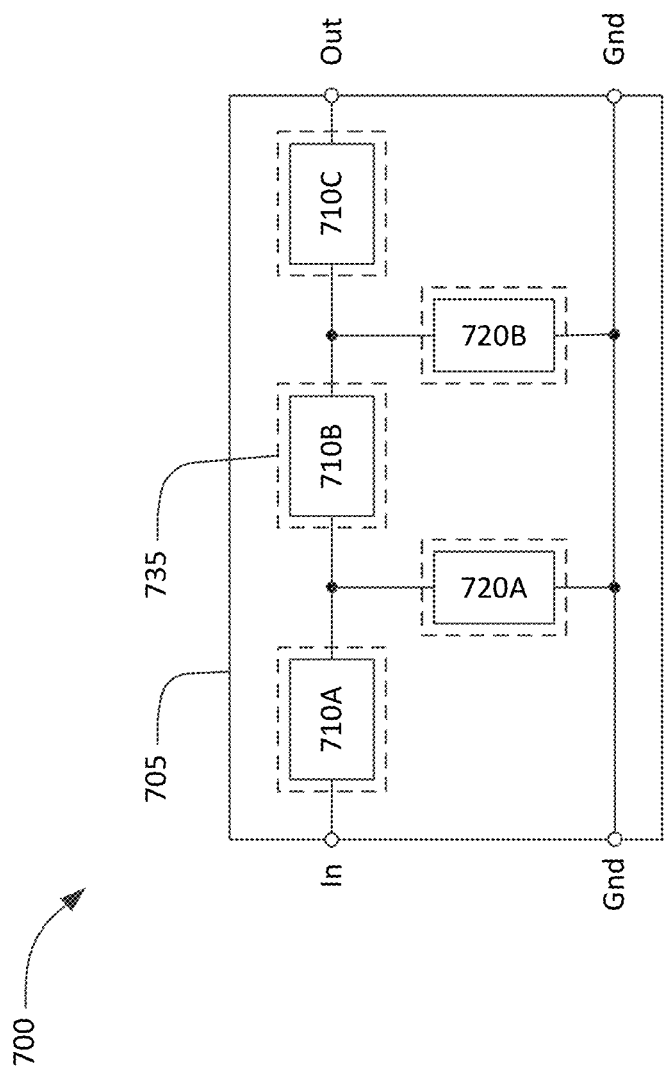
FIG. 7 is a schematic circuit diagram for a high frequency band-pass filter using XBARs.

FIG. 7 is a schematic circuit diagram and layout for a high frequency band-pass filter 700 using XBARs. The filter 700 has a conventional ladder filter architecture including three series resonators 710A, 710B, 710C and two shunt resonators 720A, 720B. The three series resonators 710A, 710B, and 710C are connected in series between a first port and a second port. In FIG. 7, the first and second ports are labeled "In" and "Out", respectively. However, the filter 700 is bidirectional and either port and serve as the input or output of the filter. The two shunt resonators 720A, 720B are connected from nodes between the series resonators to ground. All the shunt resonators and series resonators are XBARs on a single die.

The three series resonators 710A, B, C and the two shunt resonators 720A, B of the filter 700 are formed on a single plate 705 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 7, the cavities are illustrated schematically as the dashed rectangles (such as the rectangle 735). In this example, each IDT is disposed over a respective cavity. In other filters, the IDTs of two or more resonators may be disposed over a single cavity.

Figure 8:
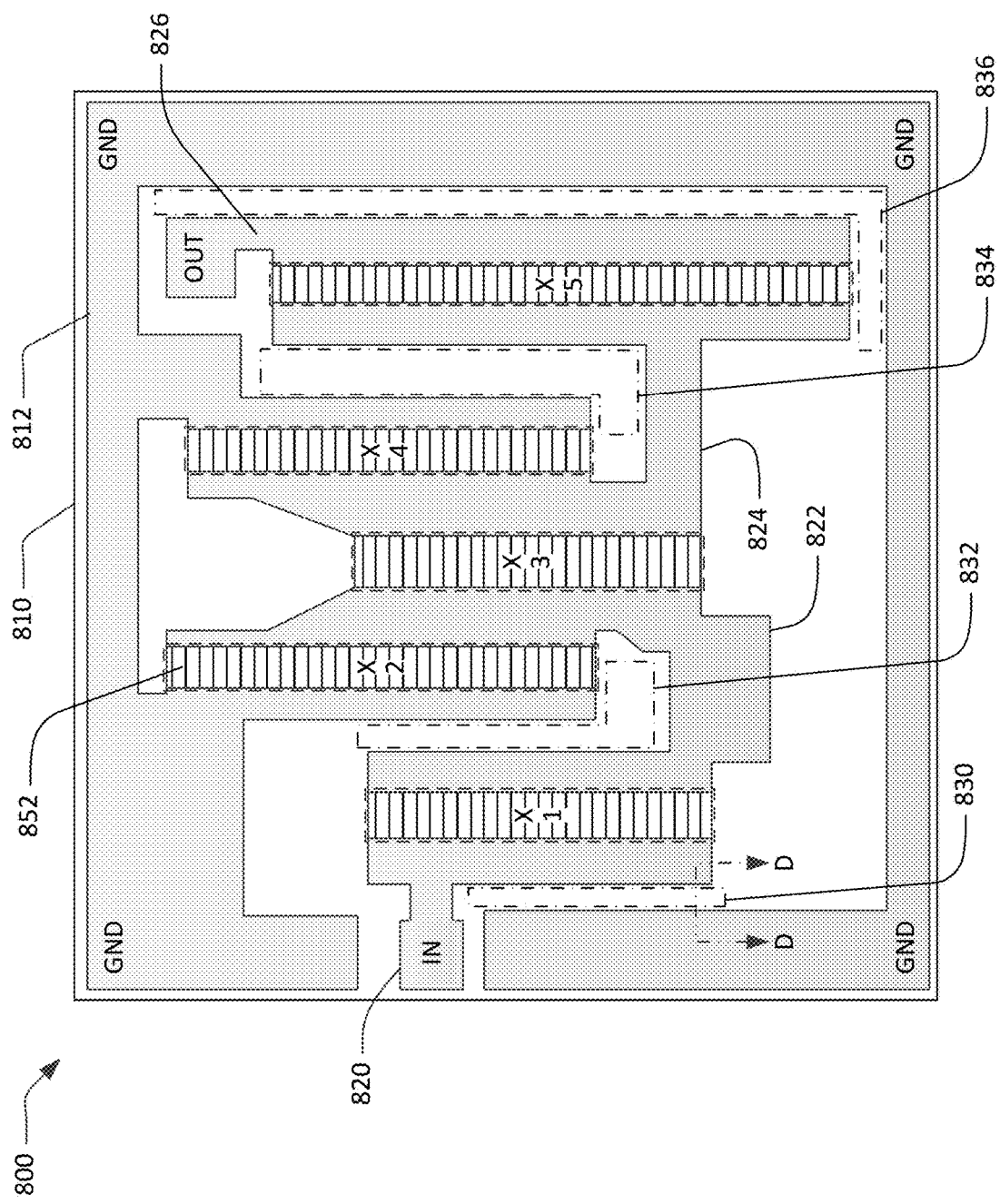
FIG. 8 is a schematic plan view of a filter incorporating five XBAR devices.

FIG. 8 is a schematic plan view of a filter 800 incorporating five XBAR devices labeled "X1" to "X5". The filter chip is exemplary and does not represent any particular application. Filter 800 may be filter 700 of FIG. 7, where device X1 is series resonator 710A, device X2 is shunt resonator 720A, device X3 is series resonator 710B, device X4 is shunt resonator 720B, and device X5 is series resonator 710C. The filter 800 may be formed on a single chip. The chip may be a chip that is diced from other chips such as from a wafer.

The filter 800 may include a piezoelectric plate 810, such as the piezoelectric plates 110 and 310, attached to a substrate, such as the substrates 120, 320. In FIG. 8, horizontally-hatched areas, such as 852, represent the IDTs and/or fingers of the XBAR devices. The fingers of the IDTs are not to scale. All or portions of the IDT fingers of each XBAR are disposed on respective diaphragms where portions of the piezoelectric plate span cavities (not shown) in the substrate. Shaded areas represent conductors (other than the IDT fingers) on the surface of the piezoelectric plate. These conductors include the busbars of the IDTs of the five XBARS, signal conductors, and ground conductors. The signal and ground conductors connect the five XBARs in a ladder filter circuit such as the filter 700.

A "ground conductor" is a conductor that is intended to be connected to a circuit ground external to a filter chip. A ground conductor is connected to at least one ground pad for connection to a ground external to the filter chip. In this example, ground conductor 812 is connected to or part of busbars on one side of the XBARs X2 and X4. Ground conductor 812 is also connected to four ground pads (GND) for connection to a ground plane external to the filter 800.

A "signal conductor" is a conductor that conveys an RF signal between two XBARs or between one or more XBARs and pads for connection to circuitry external to a filter chip. In this example, signal conductors include an input signal conductor 820 which is connected between an IN pad and a busbar of XBAR X1. A second signal conductor 822 is connected to or part of busbars of the XBARS X1, X2, and X3. A third signal conductor 824 is connected to or part of busbars of the XBARS X3, X4, and X5. An output signal conductor 826 is connected an OUT pad and a busbar on one side of the XBAR X5. The input conductor 820 is connected to an input signal of the filter 800 via the IN pad and the output conductor 826 is connected to an output signal for the filter 800 via the OUT pad.

In FIG. 8, areas of the filter 800 that are not horizontally hatched or shaded represent portions of the piezoelectric plate exposed between and around the conductors and XBAR devices. These portions of the piezoelectric plate are unnecessary for the function of the filter 800 and will be referred to herein as "excess piezoelectric material".

Two conductors are considered "adjacent" if an edge of one conductor faces an edge of the other conductor with no intervening conductors. In this example, each of the signal conductors 820, 822, 824, and 826 is adjacent to a respective part of the ground conductor 810 for at least a portion of the length of each signal conductor. Each of the signal conductors 820, 822, 824, and 826 is parallel to the respective part of the ground conductor 810 for at least a portion of the length of each signal conductor. However, adjacent conductors are not necessarily parallel. As previously shown in FIG. 5 and FIG. 6, the electric field between two adjacent conductors can induce acoustic waves in the excess piezoelectric material between the two conductors. Such acoustic waves can result in acoustic energy loss that contributes to the insertion loss of a filter.

A solution to prevent or reduce acoustic energy loss is to remove all or portions of the excess piezoelectric material between pairs of conductors having different electric potential. For example, to reduce acoustic energy loss in the filter 800, all or portions of the piezoelectric plate between a pair of conductors may be removed, forming an opening through the piezoelectric plate. For example, the excess piezoelectric material may be removed to form openings in the piezoelectric plate 830, 832, 834, and 836 (bounded by dot-dash lines) between the signal and ground conductors. These openings are exemplary, and the piezoelectric material may be removed from smaller, larger, or additional areas of the filter 800. The excess piezoelectric material may be removed, to the extent possible, from the entire surface area of the filter 800 except the areas of the XBAR diaphragms and areas under the signal conductors, the ground conductors, and the contact pads. Excess piezoelectric material may be removed, for example, by etching through a suitable photomask before or after forming the signal and ground conductors and IDTs of the XBARS.

Figure 9A:
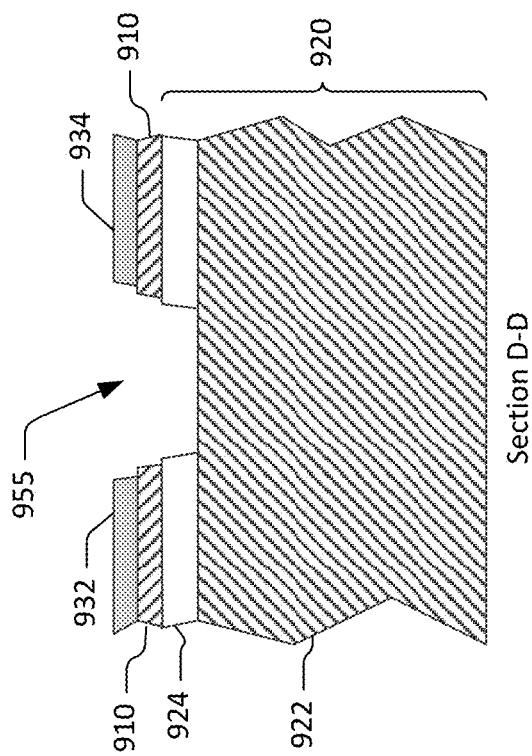
FIGS. 9A and 9B are alternative schematic cross-sectional views at the plane D-D defined in FIG. 8.

FIG. 9A is a cross-sectional view at section plane D-D defined in FIG. 8. FIG. 9A shows a piezoelectric plate 910, substrate 920, and conductors 932 and 934. The substrate 920 includes a base 922 and may include an intermediate layer 924. The thicknesses of these elements are greatly exaggerated for ease of depiction. Excess piezoelectric material has been removed to form an opening 950 through the piezoelectric plate 910 between the conductors 932, 934. For ease of depiction, the conductors 932, 934 are shown as a single material layer, but may have multiple layers of the same or different materials. As previously described, removing the excess piezoelectric material between conductors reduces or prevents undesired loss of acoustic energy into the substrate and thus may desirably improve the insertion loss of a filter. Removing the excess piezoelectric material to form the opening 950 will also provide the benefit of reducing the capacitance between the conductors 932, 934.

Ideally, all of the excess piezoelectric material between the conductors 932, 934 would be removed when the opening 950 is formed. In practice, manufacturing tolerances and process considerations may limit the extent of the opening 950. For example, a photolithographic process used to define the opening 950 may require a minimum offset distance d3 between the edges of the conductors 932, 934 and the edges of the opening 950. In such case, the width d2 of the opening 950 will be less than the distance d1 between the conductors 932, 934 less twice the offset d3. In other cases, practically all of the excess piezoelectric material may be removed between a pair of conductors, where "practically all" means "as much as possible as limited by manufacturing considerations".

Figure 9B:
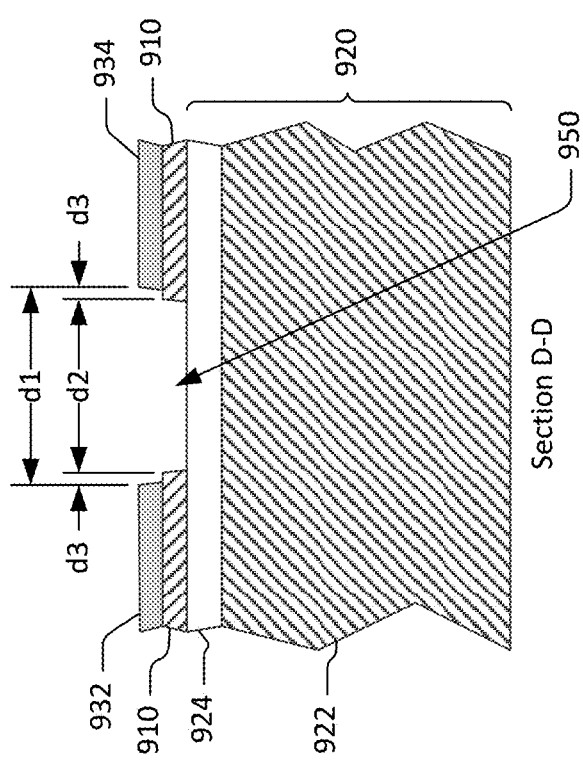

FIG. 9B is an alternative cross-sectional view at section plane D-D defined in FIG. 8. FIG. 9B shows a piezoelectric plate 910, substrate 920, and conductors 932 and 934. The substrate 920 includes a base 922 and may include an intermediate layer 924. The thicknesses of these elements are greatly exaggerated for ease of depiction. Excess piezoelectric material and some or all of the intermediate layer 924 have been removed to form an opening 955 through the piezoelectric plate in the area between the conductors 932, 934. The opening 955 may extend into, or through the intermediate layer. As previously described, removing the piezoelectric material between conductors reduces or prevents loss of acoustic energy into the substrate and thus may improve the insertion loss of a filter. Removing the excess piezoelectric material to form the opening 955 will also reduce the capacitance between the conductors 932, 934. Removing some or all of the intermediate layer 924 below or in the opening 955 will further reduce the capacitance compared to the device of FIG. 9A.

Description of Methods

Figure 10:
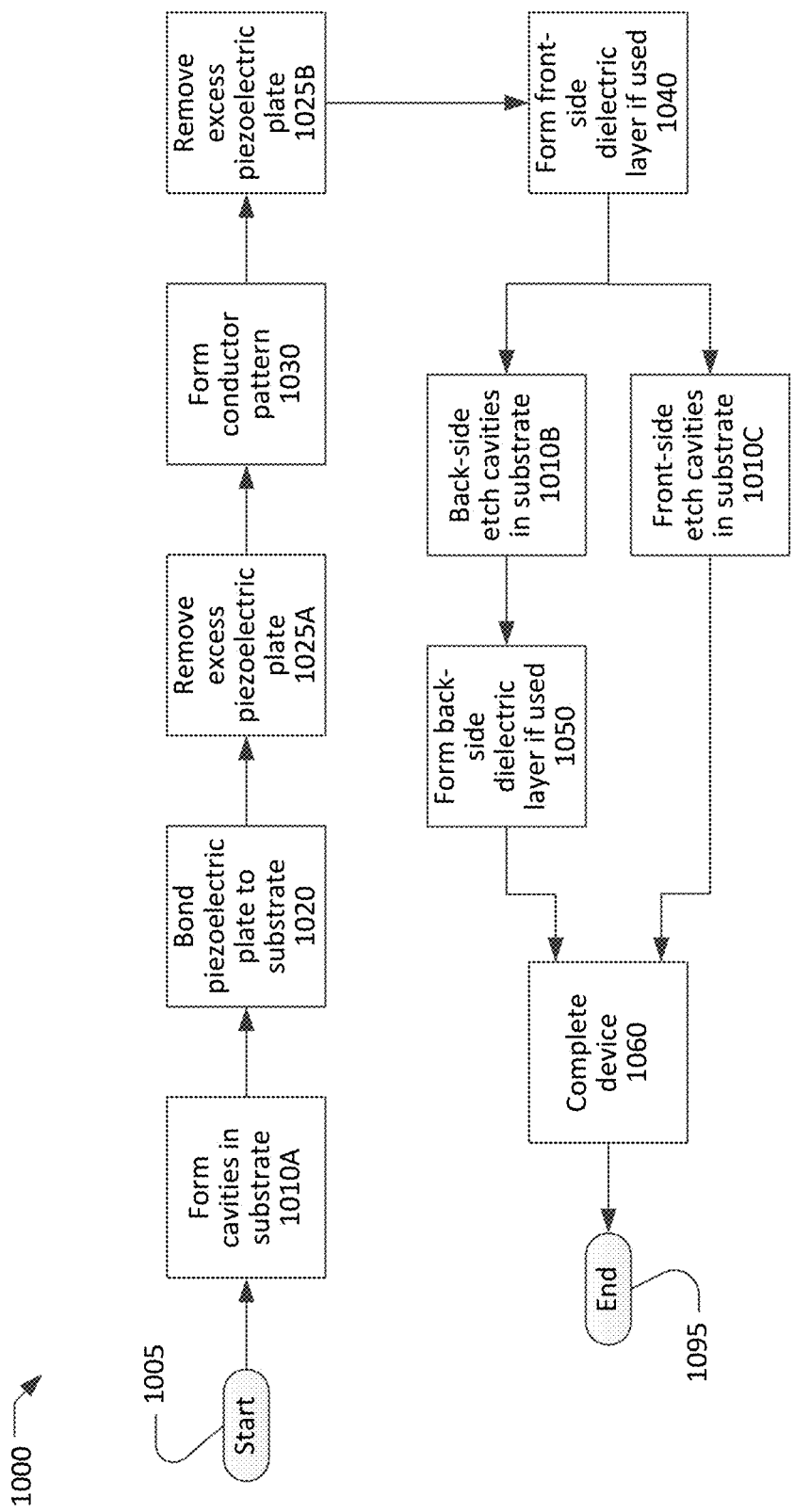
FIG. 10 is a flow chart showing a process for making an XBAR having excess piezoelectric material removed.

FIG. 10 is a simplified flow chart showing a process 1000 for making an XBAR having excess piezoelectric material removed or a filter incorporating XBARs having excess piezoelectric material removed. This is the same as the process defined in pending application Ser. No. 16/438,121, which is incorporated herein by reference, with the added step of removing the excess piezoelectric material at 1025A before the conductor patterns are formed at 1030 or at 1025B after the conductor patterns are formed. The process 1000 starts at 1005 with a substrate and a plate of piezoelectric material and ends at 1095 with a completed XBAR or filter having excess piezoelectric material removed, such as shown for FIGS. 8, 9A, and/or 9B. As will be described subsequently, the piezoelectric plate may be mounted on a sacrificial substrate or may be a portion of wafer of piezoelectric material. The flow chart of FIG. 10 includes only major process steps. Various conventional process steps (e.g. surface preparation, chemical mechanical processing (CMP), cleaning, inspection, deposition, photolithography, baking, annealing, monitoring, testing, etc.) may be performed before, between, after, and during the steps shown in FIG. 10.

The flow chart of FIG. 10 captures three variations of the process 1000 for making an XBAR which differ in when and how cavities are formed in the substrate. The cavities may be formed at steps 1010A, 1010B, or 1010C. Only one of these steps is performed in each of the three variations of the process 1000.

The flow chart of FIG. 10 also captures two variations of the process 1000 for making an XBAR which differ in when and how excess piezoelectric material is removed. The excess piezoelectric material may be removed at step 1025A or 1025B. Only one of these steps may be performed in each variations of the process 1000. In another variation, some of the excess piezoelectric material may be removed at step 1025A and more of it removed at step 1025B.

The piezoelectric plate may be, for example, Z-cut, rotated Z-cut, or rotated Y-cut lithium niobate or lithium tantalate or a material noted for plate 110. The piezoelectric plate may be some other material and/or some other cut. The substrate may be silicon. The substrate may be some other material that allows formation of deep cavities by etching or other processing. The silicon substrate may have layers of silicon and polycrystalline silicon. The substrate may include a base, which may typically bee silicon, and an intermediate layer, which may be silicon dioxide or another dielectric material.

In one variation of the process 1000, one or more cavities are formed in the substrate at 1010A, before the piezoelectric plate is bonded to the substrate at 1020. A separate cavity may be formed for each resonator in a filter device. The one or more cavities may be formed using conventional photolithographic and etching techniques. These techniques may be isotropic or anisotropic; and may use deep reactive ion etching (DRIE). Typically, the cavities formed at 1010A will not penetrate through the substrate, and the resulting resonator devices will have a cross-section as shown in FIG. 3.

At 1020, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers. In some cases, bonding layer 524 may be used to bond the plate to the substrate.

In a first variation of 1020, the piezoelectric plate is initially mounted on a sacrificial substrate. After the piezoelectric plate and the substrate are bonded, the sacrificial substrate, and any intervening layers, are removed to expose the surface of the piezoelectric plate (the surface that previously faced the sacrificial substrate). The sacrificial substrate may be removed, for example, by material-dependent wet or dry etching or some other process.

In a second variation of 1020 starts with a single-crystal piezoelectric wafer. Ions are implanted to a controlled depth beneath a surface of the piezoelectric wafer (not shown in FIG. 10). The portion of the wafer from the surface to the depth of the ion implantation is (or will become) the thin piezoelectric plate and the balance of the wafer is effectively the sacrificial substrate. After the implanted surface of the piezoelectric wafer and device substrate are bonded, the piezoelectric wafer may be split at the plane of the implanted ions (for example, using thermal shock), leaving a thin plate of piezoelectric material exposed and bonded to the substrate. The thickness of the thin plate piezoelectric material is determined by the energy (and thus depth) of the implanted ions. The process of ion implantation and subsequent separation of a thin plate is commonly referred to as "ion slicing". The exposed surface of the thin piezoelectric plate may be polished or planarized after the piezoelectric wafer is split.

In one variation of the process 1000, at 1025A, excess portions of the piezoelectric material are removed to form openings through the piezoelectric plate between conductors having different potential. At 1025A, the excess piezoelectric material is removed after the piezoelectric plate is bonded to the substrate at 1020 and before the conductor pattern is formed at 1030. This piezoelectric material removed may include excess piezoelectric material between conductors (other than the resonator IDTs) of an RF filter to avoid exciting acoustic modes that then couple to the substrate and increase insertion loss. This removing may include removing the excess piezoelectric material to form openings through the piezoelectric plate between pairs of conductors outside of the XBAR resonators of an RF filter, such as from between a signal conductor and a ground conductor, or from between two signal conductors.

The excess portions of the piezoelectric material may be removed by patterning and etching. Removing the portions of piezoelectric material may include removing all of a portion of an intermediate layer 524 that is below the excess portions of the piezoelectric layer that are removed, such as shown in FIG. 9B. In other cases, those portions of layer 524 are not removed and remain, such as shown in FIG. 9A. The intermediate layer 524 may be used as an etch stop for removing the excess portions piezoelectric material.

Conductor patterns defining one or more XBAR devices are formed on the surface of the piezoelectric plate at 1030. Typically, a filter device will have two or more conductor layers that are sequentially deposited and patterned. The conductor layers may include bonding pads, gold or solder bumps, or other means for making connection between the device and external circuitry. The conductor layers may be, for example, aluminum, an aluminum alloy, copper, a copper alloy, molybdenum, tungsten, beryllium, gold, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layers and the piezoelectric plate. The conductor layers may include bonding pads, gold or solder bumps, or other means for making connection between the device and external circuitry.

Conductor patterns may be formed at 1030 by depositing the conductor layers over the surface of the piezoelectric plate and removing excess metal by etching through patterned photoresist. Alternatively, the conductor patterns may be formed at 1030 using a lift-off process. Photoresist may be deposited over the piezoelectric plate and patterned to define the conductor pattern. The conductor layer may be deposited in sequence over the surface of the piezoelectric plate. The photoresist may then be removed, which removes the excess material, leaving the conductor pattern.

In another variation of the process 1000, at 1025B, excess portions of the piezoelectric material are removed to form openings through the piezoelectric plate between conductors having different potential, as previously described with respect to 1025A.

At 1040, a front-side dielectric layer or layers may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 1040 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The one or more dielectric layers may include, for example, a dielectric layer selectively formed over the IDTs of shunt resonators to shift the resonance frequency of the shunt resonators relative to the resonance frequency of series resonators as described in U.S. Pat. No. 10,491,192. The one or more dielectric layers may include an encapsulation/passivation layer deposited over all or a substantial portion of the device.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In a second variation of the process 1000, one or more cavities are formed in the back side of the substrate at 1010B after all the conductor patterns and dielectric layers are formed at 1030, and after 1025A or 1025B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1. After the one or more cavities are formed at 1010B, an optional back-side dielectric layer may be added to the back side of the piezoelectric plate at 1050.

In a third variation of the process 1000, one or more cavities in the form of recesses in the substrate top layer 322 may be formed at 1010C by etching a sacrificial layer formed in the front side of the substrate using an etchant introduced through openings (e.g., openings 342) in the piezoelectric plate. A separate cavity may be formed for each resonator in a filter device. The one or more cavities may be formed using an isotropic or orientation-independent dry etch that passes through holes in the piezoelectric plate and etches the sacrificial layer formed in recesses in the front-side of the substrate. The one or more cavities formed at 1010C will not penetrate completely through the substrate top layer 322, and the resulting resonator devices will have a cross-section as shown in FIG. 3.

In all variations of the process 1000, the filter or XBAR device is completed at 1060. Actions that may occur at 1060 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1060 is to tune the resonant frequencies of the resonators within a filter device by adding or removing metal or dielectric material from the front side of the device. After the filter device is completed, the process ends at 1095.

Forming the cavities at 1010A may require the fewest total process steps but has the disadvantage that the XBAR diaphragms will be unsupported during all of the subsequent process steps. This may lead to damage to, or unacceptable distortion of, the diaphragms during subsequent processing.

Forming the cavities using a back-side etch at 1010B requires additional handling inherent in two-sided wafer processing. Forming the cavities from the back side also greatly complicates packaging the XBAR devices since both the front side and the back side of the device must be sealed by the package.

Forming the cavities by etching from the front side at 1010C does not require two-sided wafer processing and has the advantage that the XBAR diaphragms are supported during all of the preceding process steps. However, an etching process capable of forming the cavities through openings in the piezoelectric plate will necessarily be isotropic. However, such an etching process using a sacrificial material allows for a controlled etching of the cavity, both laterally (i.e. parallel to the surface of the substrate) as well as normal to the surface of the substrate.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device comprising:
   a piezoelectric layer;
   a conductor pattern on a surface of the piezoelectric layer, the conductor pattern comprising:
      interdigital transducers (IDTs) of a plurality of transversely-excited film bulk acoustic resonators (XBARs), and
      a plurality of conductors connecting the IDTs of the plurality of XBARs in a ladder filter circuit architecture, the plurality of conductors including a first conductor adjacent to a second conductor; and
   an opening through the piezoelectric layer between the first conductor and the second conductor,
   wherein the opening comprises a width that is less than a distance between the first conductor and the second conductor.

2. The filter device of claim 1, further comprising:
   a substrate,
   wherein the piezoelectric layer is attached to the substrate, and
   wherein interleaved fingers of each of the plurality of IDTs are on respective portions of the piezoelectric layer that span respective cavities in the substrate.

3. The filter device of claim 2, wherein:
   the substrate comprises a base and an intermediate layer between the base and the piezoelectric layer, and
   the cavities are in the intermediate layer.

4. The filter device of claim 3, wherein all of the intermediate layer is removed where the opening extends through the piezoelectric layer between the first conductor and the second conductor.

5. The filter device of claim 1, further comprising one or more additional openings through the piezoelectric layer between other adjacent conductors of the plurality of conductors.

6. The filter device of claim 1, further comprising additional openings through the piezoelectric layer between all other pairs of adjacent conductors of the plurality of conductors.

7. The filter device of claim 1, wherein the first conductor is a signal conductor and the second conductor is a ground conductor.

8. The filter device of claim 1, wherein the first conductor and the second conductor are signal conductors.

9. A method for fabricating a filter device comprising:
   forming a conductor pattern on a surface of a piezoelectric layer, the conductor pattern comprising:
      interdigital transducers (IDTs) of a plurality of transversely-excited film bulk acoustic resonators (XBARs), and
      a plurality of conductors connecting the IDTs of the plurality of XBARs in a ladder filter circuit architecture, the plurality of conductors including a first conductor adjacent to a second conductor; and
   forming an opening through the piezoelectric layer between the first conductor and the second conductor,
   wherein the opening comprises a width that is less than a distance between the first conductor and the second conductor.

10. The method of claim 9, wherein the first conductor is a signal conductor and the second conductor is a ground conductor.

11. The method of claim 9, wherein the first conductor and the second conductor are signal conductors.

12. The method of claim 9, wherein the opening encompasses practically all of an area between adjacent portions of the first and second conductors.

13. The method of claim 9, wherein forming the opening further comprises forming one or more additional openings through the piezoelectric layer between other adjacent conductors from the plurality of conductors.

14. The method of claim 9, wherein forming the opening further comprises forming additional openings through the piezoelectric layer between all other pairs of adjacent conductors from the plurality of conductors.

15. The method of claim 9, further comprising:
attaching the piezoelectric layer to a substrate,
wherein interleaved fingers of the plurality of IDTs are on a respective portions of the piezoelectric layer that span respective cavities in the substrate.

16. The method of claim 9, wherein:
the substrate comprises a base and an intermediate layer between the base and the piezoelectric layer, and
the cavities are in the intermediate layer.

17. The method of claim 16, further comprising removing all of the intermediate layer to form the opening that extends through the piezoelectric layer between the first conductor and the second conductor.

18. A filter device comprising:
a piezoelectric layer;
a conductor pattern on a surface of the piezoelectric layer, the conductor pattern comprising:
  interdigital transducers (IDTs) of a plurality of transversely-excited film bulk acoustic resonators (XBARs), and
  a plurality of conductors connecting the IDTs of the plurality of XBARs in a ladder filter circuit architecture, the plurality of conductors including a first conductor adjacent to a second conductor; and
an opening through the piezoelectric layer between the first conductor and the second conductor,
wherein the opening encompasses practically all of an area between adjacent portions of the first and second conductors.

19. The filter device of claim 18, wherein the opening that encompasses practically all of the area between adjacent portions of the first and second conductors is as large an area as possible as limited by manufacturing tolerances of the filter device.

* * * * *